US008641351B2

(12) United States Patent
Shimomura (10) Patent No.: US 8,641,351 B2
(45) Date of Patent: Feb. 4, 2014

(54) ROBOT AND INSTRUCTION METHOD THEREOF

(75) Inventor: Nobuyasu Shimomura, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 608 days.

(21) Appl. No.: 13/002,998

(22) PCT Filed: Jul. 10, 2008

(86) PCT No.: PCT/JP2008/062491
§ 371 (c)(1),
(2), (4) Date: Jan. 7, 2011

(87) PCT Pub. No.: WO2010/004636
PCT Pub. Date: Jan. 14, 2010

(65) Prior Publication Data
US 2011/0160897 A1   Jun. 30, 2011

(51) Int. Cl.
*B65G 65/00* (2006.01)
(52) U.S. Cl.
USPC .............. 414/222.01; 414/222.13; 414/805; 414/217; 414/757; 700/217; 700/213; 901/40
(58) Field of Classification Search
USPC .............. 414/222.01, 805, 217, 222.13, 757; 700/217, 213; 901/40, 27; 33/503; 118/313
See application file for complete search history.

(56) References Cited

U.S. PATENT DOCUMENTS

| 6,242,879 B1 | 6/2001 | Sagues et al. | |
| 7,806,643 B2 * | 10/2010 | Friedman et al. | 414/222.01 |
| 8,434,989 B2 * | 5/2013 | van Der Meulen | 414/217 |
| 8,435,738 B2 * | 5/2013 | Holmes | 435/6.1 |
| 2003/0151268 A1 * | 8/2003 | Holbrooks | 294/103.1 |
| 2006/0039781 A1 * | 2/2006 | Niewmierzycki et al. | 414/217 |
| 2006/0099054 A1 * | 5/2006 | Friedman et al. | 414/217 |
| 2006/0216137 A1 * | 9/2006 | Sakata et al. | 414/222.13 |
| 2008/0131237 A1 * | 6/2008 | van der Meulen | 414/217 |
| 2008/0223293 A1 * | 9/2008 | Ishikawa et al. | 118/313 |

(Continued)

FOREIGN PATENT DOCUMENTS

JP   A-2004-296484   10/2004
JP   A-2006-185960   7/2006

OTHER PUBLICATIONS

International Search Report dated Aug. 12, 2008 in International Patent Application No. PCT/JP2008/062491.

(Continued)

*Primary Examiner* — Ronnie Mancho
(74) *Attorney, Agent, or Firm* — Oliff PLC (57) ABSTRACT

A robot control unit that turns off a holding unit for a plate member, while the plate member is placed on an end effector, and lower the end effector, by a predetermined distance, from an initial position higher than a preset temporary placing position toward the temporary placing position. Then the robot control unit switches the holding member, from an OFF state to an ON state, while the end effector is stopped, and determines whether the plate member is held by the holding unit, with a holding-state detection unit. When the plate member is held by the holding unit, the robot control unit turns off the holding unit while further lowering the end effector by the predetermined distance. When the plate member is not held by the holding unit, the robot control unit detects a position of the end effector at this point of time, as a normal placing position.

7 Claims, 6 Drawing Sheets

(56) References Cited

U.S. PATENT DOCUMENTS

2008/0226429 A1* 9/2008 van der Meulen ............ 414/217
2008/0232947 A1* 9/2008 van der Meulen et al. ... 414/805
2008/0232948 A1* 9/2008 van der Meulen et al. ... 414/805
2011/0142575 A1* 6/2011 Friedman et al. ........ 414/222.01

OTHER PUBLICATIONS

International Preliminary Report on Patentability issued in International Application No. PCT/JP2008/062491 dated Feb. 17, 2011.

* cited by examiner

ROBOT AND INSTRUCTION METHOD THEREOF

TECHNICAL FIELD

The present invention relates to a robot which can be instructed about a target position as well as to an instruction method thereof, and in particular relates to the robot which can be instructed about the target position in a vertical direction as well as to the instruction method thereof.

BACKGROUND ART

In the past, a robot provided with a movable or articulated arm has been used upon carrying a work, such as a silicon wafer used for manufacturing semiconductors, a glass substrate used for manufacturing a liquid crystal display panel, and the like. The robot of this type has a function that can be instructed in advance about a predetermined target position in order to accurately carry the work to the predetermined position.

In recent years, with an attempt to manufacture more large-sized semiconductor wafers and/or glass substrates, instruction to the robot has been more difficult and thus required higher skill of an operator. If the skill of the operator is not sufficient, serious mistakes may tend to occur upon instructing the robot. Therefore, there is a need for a technique for adequately instructing the robot about an accurate position, without relying on any highly specialized skill of the operator.

Patent Document 1 describes one method for obtaining an instruction point by detecting a position of a target by using a three-axis-scalar type robot. In this method, an end effector of the robot is moved toward the target attached to a cassette or the like, so as to be in contact with the target. At this time, changes in torque and speed are detected. Then, the detected changes are compared between the case in which the end effector is contacted with the target and the case in which the end effector is not contacted with the target, respectively. In this way, a contact point (or points) of the end effector with the target can be detected, thereby calculating the position of the target from the detected contact point, thus obtaining the instruction point.

Patent Document 1: U.S. Pat. No. 6,242,879

However, in the conventional instruction method described above, when the end effector is contacted with the target, the end effector and/or target may be deformed as well as unwanted particles may be generated. In order to avoid such problems, the robot should be moved at a very low speed. In such a case, however, accuracy of positional detection may tend to be significantly deteriorated due to various fluctuation factors and other factors that may be changed with time in a drive system of the robot. As used herein, the fluctuation factors include fluctuation due to the torque, friction and the like, while the factors that may be changed with time include hysteresis and the like.

In particular, in the case in which the target position in the vertical direction is instructed, some reaction force will be exerted on the end effector in a thickness direction (or vertical direction), from the target. Therefore, the end effector may tend to be deformed, thus making it difficult to detect the target position with high accuracy.

For instance, the end effector of the robot for carrying the semiconductor wafer is designed to access a wafer cassette produced based on the SEMI (Semiconductor Equipment and Materials International) standard. Therefore, the thickness of the end effector is limited within a range of from approximately 2 to 4 mm, and it would be quite difficult or impossible to apply the end effector having the thickness exceeding the above range to the wafer cassette based on the SEMI standard. In addition, based on the size of the semiconductor wafers manufactured in recent years, the length of the end effector should be within a range of from approximately 200 to 300 mm.

Namely, the end effector of the robot currently used for carrying the semiconductor should be sized to have an about 2 to 4 mm thickness and an about 200 to 300 mm length. Therefore, if assuming that the weight (e.g., 10 to 30 kg) of the robot supported in the vertical direction (or Z-axial direction) will directly correspond to the contact reaction force exerted on the robot from the target, it will be quite difficult to detect a signal without deforming the end effector. Namely, if such reaction force is exerted on the end effector upon the contact with the target, the end effector will be seriously damaged, thus deteriorating the accuracy of detection of the target.

DISCLOSURE OF INVENTION

The present invention was made in light of the above circumstances, and it is therefore an object of this invention to provide a new robot and a new instruction method thereof, which can detect the target position in the vertical direction with higher accuracy, while preventing the deformation of the end effector and/or target as well as avoiding the generation of unwanted particles.

In order to solve the above problems, the robot according to the present invention comprises: a robot arm having a distal end at which an end effector is provided; arm drive unit configured to move the robot arm at least in a vertical direction; holding unit provided to the end effector in order to hold a plate member; holding-state detection unit configured to detect whether or not the plate member is held by the holding unit; and robot control unit configured to control the arm drive unit and the holding unit, wherein the robot control unit is configured to turn off the holding unit while the plate member is placed on the end effector, and control the arm drive unit to lower the end effector, by a predetermined distance, from an initial position higher than a preset temporary placing position toward the temporary placing position, switch the holding unit from an OFF state to an ON state while the end effector is stopped; and determine whether or not the plate member is held by the holding unit by using the holding-state detection unit, and wherein in a case in which the plate member is determined to be held by the holding unit, the robot control unit will turn off the holding unit and further lower the end effector by the predetermined distance, and determine again whether or not the plate member is held by the holding unit while the end effector is stopped, and wherein in a case in which the plate member is determined not to be held by the holding unit, the robot control unit will detect a position of the end effector at this point of time as a normal placing position.

Preferably, the holding unit has vacuum suction unit configured to suck the plate member. The holding-state detection unit has a vacuum sensor configured to detect that a vacuum state is achieved by the vacuum suction unit.

Preferably, the holding unit has edge grip unit including a movable engage portion configured to be releasably engaged with an edge of the plate member and a plunger configured to advance and retract the movable engage portion. The holding-state detection unit has a position sensor configured to detect a position of the plunger.

Preferably, the normal placing position is each position of a plurality of shelves provided inside a cassette with an equal pitch in the vertical direction, the cassette being configured to contain a plurality of plate members. The initial position is a central position in the vertical direction between a pair of vertically adjacent shelves.

Preferably, the robot arm is configured to be moved with degrees of freedom in X-axial and Y-axial directions as well as with a degree of freedom in Z-axial direction corresponding to the vertical direction.

Furthermore, in order to solve the above problems, the present invention is a method of instructing any one of the above-mentioned robot about the normal placing position of the plate member, comprising: a lowering step of turning off the holding unit while the plate member is placed on the end effector, and controlling the arm drive unit to lower the end effector by the predetermined distance from the initial position higher than the preset temporary placing position toward the temporary placing position; a switching step, provided after the lowering step, of switching the holding unit from the OFF state to the ON state while the end effector is stopped; a determination step, provided after the switching step, of determining whether or not the plate member is held by the holding unit by using the holding-state detection unit, wherein in the case in which the plate member is determined to be held by the holding unit, the step will be returned to the lowering step; and a detection step of detecting the position of the end effector as the normal placing position at the point of time when the plate member is determined not to be held by the holding unit in the determination step.

Preferably, the normal placing position is each position of the plurality of shelves provided inside the cassette with the equal pitch in the vertical direction, the cassette being configured to contain the plurality of plate members. The initial position is the central position in the vertical direction between the pair of vertically adjacent shelves. The method further comprises an insertion step, provided prior to a first lowering step, of inserting the plate member held by the end effector into the central position in the vertical direction in the cassette.

BEST MODE FOR CARRYING OUT THE INVENTION

Hereinafter, the robot, as an embodiment of the present invention, and instruction method thereof will be described with reference to the drawings.

Figure 1:
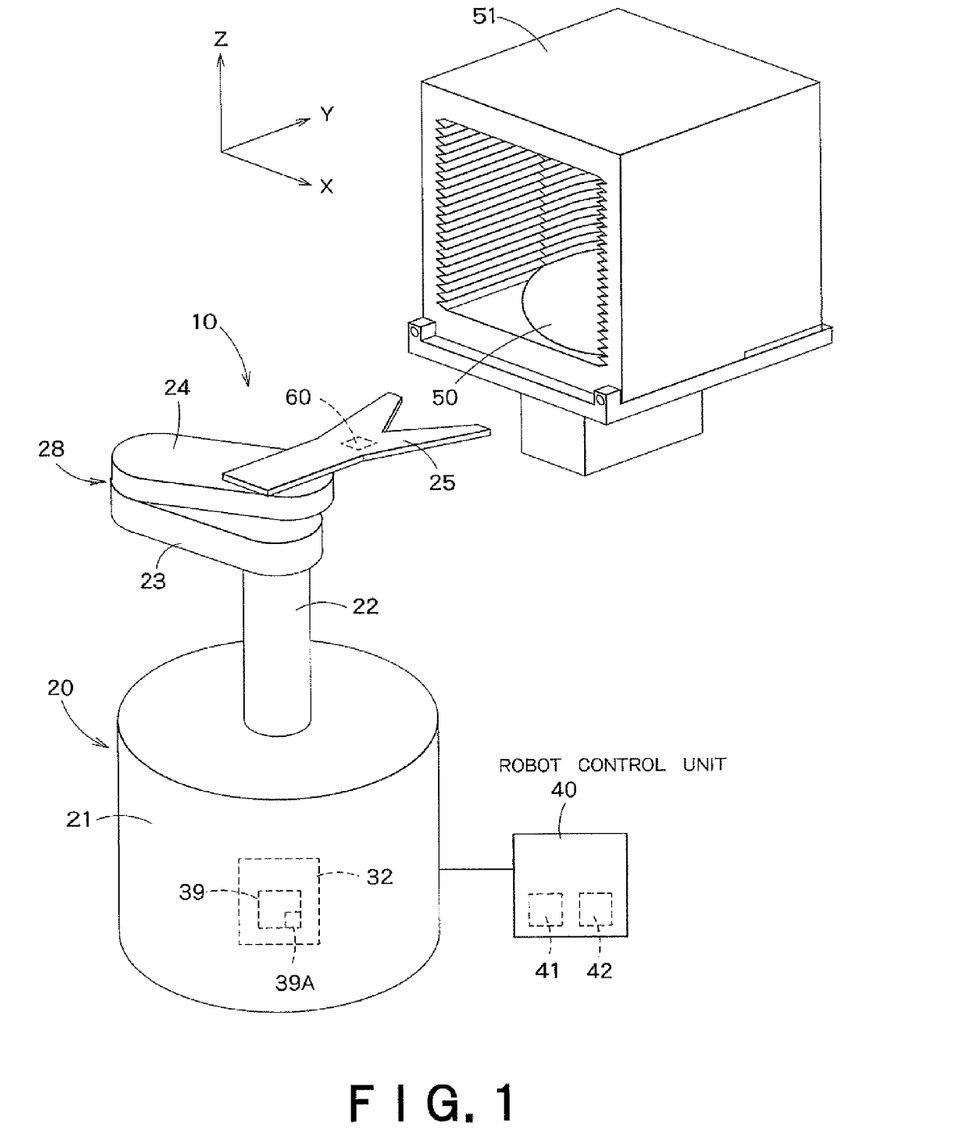
FIG. 1 is a perspective view showing the robot according to an embodiment of the present invention, together with a wafer cassette.

As shown in FIG. 1, an exemplary robot 10 according to this embodiment includes a robot main body 20 configured to carry a semiconductor wafer 50, and a robot control unit 40 configured to control an operation of the robot main body 20.

The robot main body 20 is configured to carry out the semiconductor wafer 50 from a wafer cassette 51 as well as for carrying in the semiconductor wafer 50 to the cassette 51. It is noted that the wafer cassette 51 was produced based on the SEMI (Semiconductor Equipment and Materials International) standard.

The robot main body 20 has a robot base 21. An arm shaft 22, which extends in the vertical direction and is capable of moving in the vertical direction, is provided to the robot base 21. At a top end of the arm shaft 22, a proximal end of a first arm 23 is fixed. At a distal end of the first arm 23, a proximal end of a second arm 24 is rotatably attached.

At a distal end of the second arm 24, a hand 25 that can serve as an end effector is rotatably provided. The hand 25 is configured such that the semiconductor wafer 50 can be placed thereon. In order to releasably hold the wafer 50 placed on the hand 25, the hand 25 includes a wafer holding unit 60.

The robot control unit 40 is implemented by a computer and includes a memory 41, in which an operational program for controlling the operation of the robot main body 20 is stored, and a CPU 42 configured to control the robot main body 20 by executing the operational program stored in the memory 41.

In the memory 41, data concerning the instruction point for controlling the operation of the robot main body 20 can also be stored. Thus, the hand 25 can be moved to a predetermined position based on such instruction point data stored in the memory 41. Additionally, data concerning the shape and size of the hand 25 as well as data concerning the shape and size of the wafer held by the hand 25 can also be stored in the memory 41.

Figure 2:
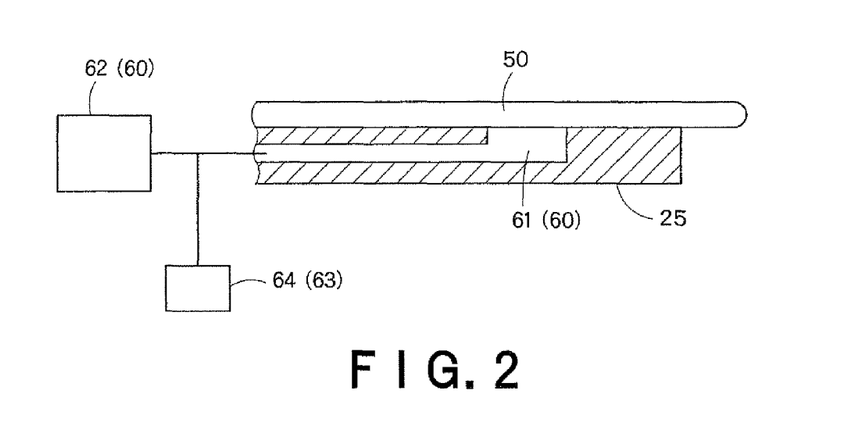
FIG. 2 is a schematic view showing an example of a wafer holding unit and a holding-state detection unit of the robot shown in FIG. 1.

As shown in FIG. 2, a vacuum suction unit 61 that can serve as the wafer holding unit 60 is provided to the hand 25 of the robot 10. The vacuum suction unit 61 is in communication with a vacuum source 62.

Furthermore, the robot 10 includes a vacuum sensor 64 that can serve as a holding-state detection unit 63 for detecting whether or not the wafer 50 is held by the wafer holding unit 60.

Namely, when the vacuum source 62 is turned on while the wafer 50 is placed on the hand 25, a vacuum state can be achieved in the vacuum suction unit 61. With detection of this vacuum state by the vacuum sensor 64, the robot can obtain information that the wafer 50 placed on the hand 25 is held by the vacuum suction unit 60. However, when this vacuum state is not detected by the vacuum sensor 64 even though the vacuum source 62 is turned on, the robot will know that the wafer 50 is not placed on the hand 25.

Figure 3:
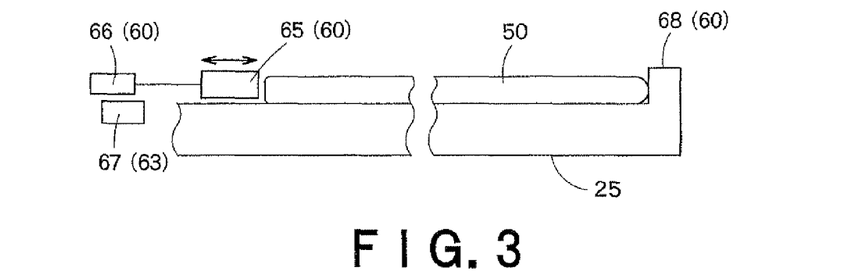
FIG. 3 is a schematic view showing another example of the wafer holding unit and holding-state detection unit of the robot shown in FIG. 1.

FIG. 3 shows an edge grip unit as another example of the wafer holding unit 60. In this example, a movable engage portion 65 configured to be releasably engaged with an edge of the wafer 50 is used as the wafer holding unit 60, together with a projection 68 provided at a distal end portion of the hand 25. The movable engage portion 65 is connected with a plunger 66, such that the movable engage portion 65 can be advanced and retracted due to actuation of the plunger 66.

The plunger 66 is provided with a position sensor 67, as the holding-state detection unit 63, configured to detect the position of the plunger 66. Namely, the position in which the actuated plunger 66 is stopped will differ between the case in which the movable engage portion 65 is engaged with the edge of the wafer 50 due to the actuation of the plunger 66 while the wafer 50 is placed or held on the hand 25 and the case in which the movable engage portion 65 is freely moved by the actuation of the plunger 66 while the wafer 50 is not placed or held on the hand 2. Thus, whether or not the wafer 50 is placed on the hand 25 can be detected by detection of the position in which the actuated plunger 66 is stopped, by using the position sensor 67.

Figure 4:
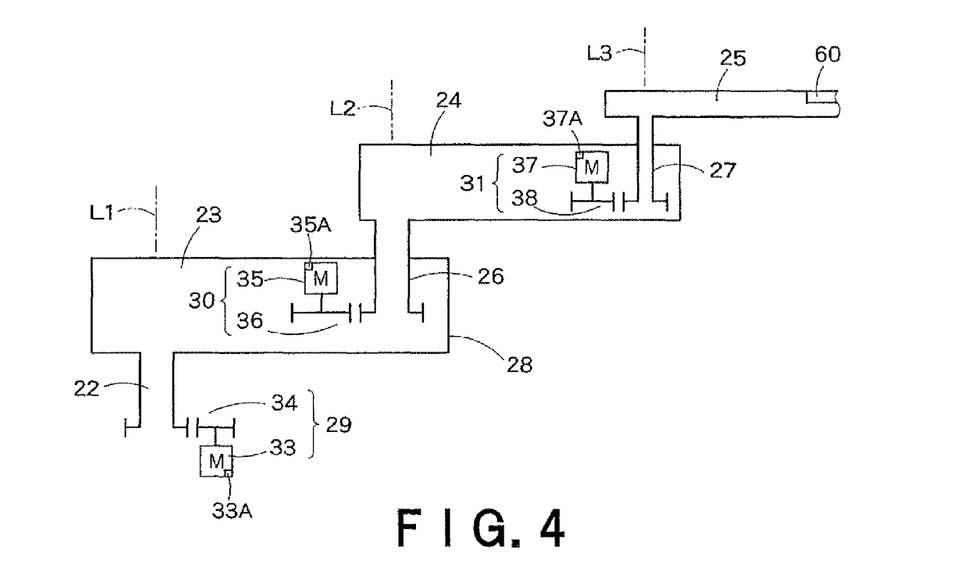
FIG. 4 is a diagram showing an internal structure of a robot arm of the robot shown in FIG. 1.

As shown in FIG. 4, the second arm 24 is fixedly attached, at its proximal end, to a second arm rotation shaft 26 rotatably provided at the distal end of the first arm 23. The hand 25 is fixedly attached, at its proximal end, to a wrist axis 27 rotatably provided at the distal end of the second arm 24.

In this manner, the robot arm 28 of the robot main body 20 includes the arm shaft 22, first arm 23, second arm 24, hand 25, second arm rotation shaft 26 and wrist axis 27. The robot arm 28 of this type is also referred to as a scalar-type horizontal articulated arm. By controlling the operation of the robot arm 28 by using the robot control unit 40, the hand 25 can be moved, in the X-axial, Y-axial and Z-axial directions, respectively, to a desired position.

Figure 5:
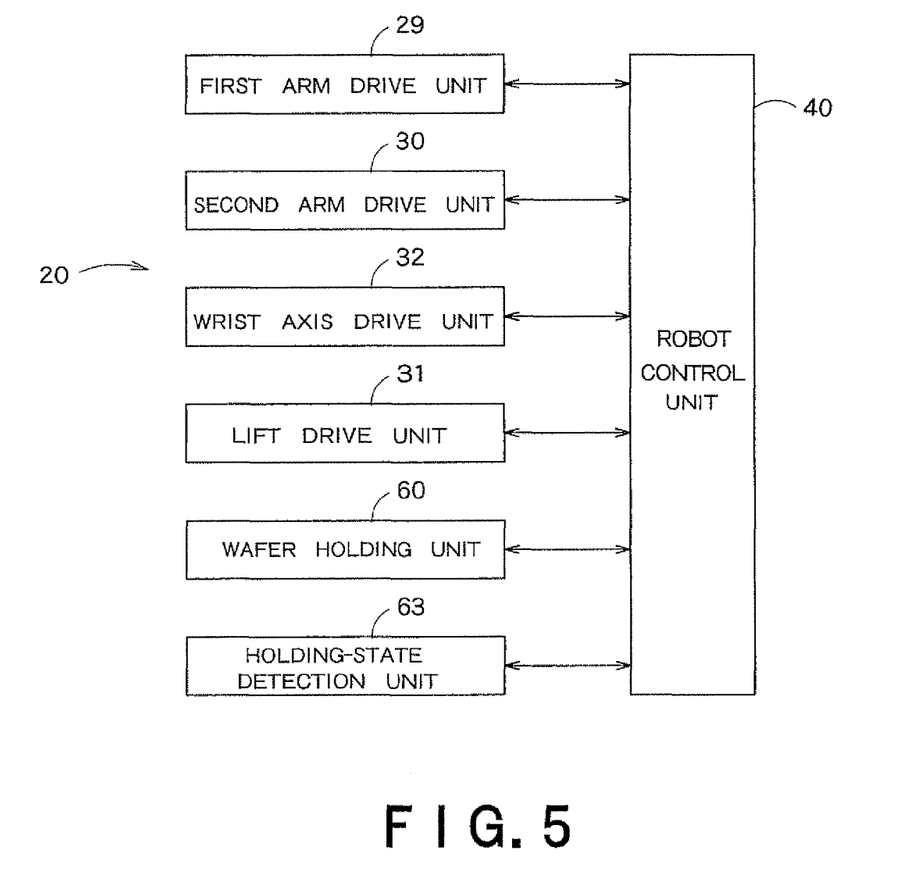
FIG. 5 is a block diagram showing construction of a control and drive system of the robot shown in FIG. 1.

As shown in FIGS. 4 and 5, the robot main body 20 further includes a first arm drive unit 29 configured to rotate the first arm 23, a second arm drive unit 30 configured to rotate the second arm 24, a wrist axis drive unit 31 configured to rotate the wrist axis 27, and a lift drive unit 32 configured to vertically drive the arm shaft 22.

The first drive unit 29 is located in an internal space of the robot base 21 and includes a servomotor 33 and a power transmission mechanism 34 thereof. The second arm drive unit 30 is located in an internal space of the first arm 23 and includes a servomotor 35 and a power transmission mechanism 36 thereof. The wrist axis drive unit 31 is located in an internal space of the second arm 24 and includes a servomotor 37 and a power transmission mechanism 38 thereof. These servomotors 33, 35, 37 incorporate encoders 33A, 35A, 37A, respectively.

For each power transmission mechanism 34, 36, 38, a gear transmission mechanism including a reduction gear can be used. In this case, power of each servomotor 33, 35, 37 is first transmitted to an input side of the reduction gear, and the torque is then amplified at a predetermined amplification ratio, while the rotation speed is reduced at a predetermined reduction ratio. In this manner, the resultant power will be outputted from an output side of the reduction gear. With such power outputted from the output side of the reduction gear, the arm shaft 22, second arm rotation shaft 26 and wrist axis 27 will be rotated, respectively. Thus, the first arm 23, second arm 24 and hand 25 will be rotated, respectively.

Alternatively, the arm shaft 22, second arm rotation shaft 26 and/or wrist axis 27 may be driven by a direct drive motor.

The lift drive unit 32 is provided in the robot base 21 and implemented by a boll-screw mechanism using a rotary motor, wherein angular displacement of the rotary motor can be optionally controlled. For instance, the lift drive unit 32 includes a screw rod, a mating member configured to be meshed with the screw rod, and the rotary motor configured to rotate the screw rod. In this case, the arm shaft 22 is fixed in position to the mating member. For the rotary motor of the lift drive unit 32, a servomotor 39 incorporating an encoder 39A is used.

In the robot main body 20 having the construction as described above, the arm shaft 22 is rotated about a rotation axis L1 relative to the robot base 21 by the first arm drive unit 29. Consequently, the first arm 23 is rotated about the rotation axis L1 relative to the robot base 21.

The second arm rotation shaft 26 is rotated about a rotation axis L2 relative to the first arm 23 by the second arm drive unit 30. Thus, the second arm 24 is rotated about the rotation axis L2 relative to the first arm 23.

Further, the wrist axis 27 is rotated about a rotation axis L3 relative to the second arm 24 by the wrist axis drive unit 31. As a result, the hand 25 is rotated about the rotation axis L3 relative to the second arm 24.

The rotation axes L1, L2, L3 are parallel with one another, and extend in the Z-axial direction (or vertical direction), respectively. Namely, the robot arm 28 having such construction as described above can be moved with degrees of freedom in the X-axial, Y-axial and Z-axial directions.

The robot control unit 40 can perform feed-back control for the drive unit 29, 30, 31, 32 by obtaining angular positions of the servomotors 33, 35, 37, 39 from the encoders 33A, 35A, 37A, 39A of the respective servomotors 33, 35, 37, 39 of the first arm drive unit 29, second arm drive unit 30, wrist axis drive unit 31 and lift drive unit 32, respectively. As such, the hand 25 can be aligned with a target position with high accuracy.

Figure 6:
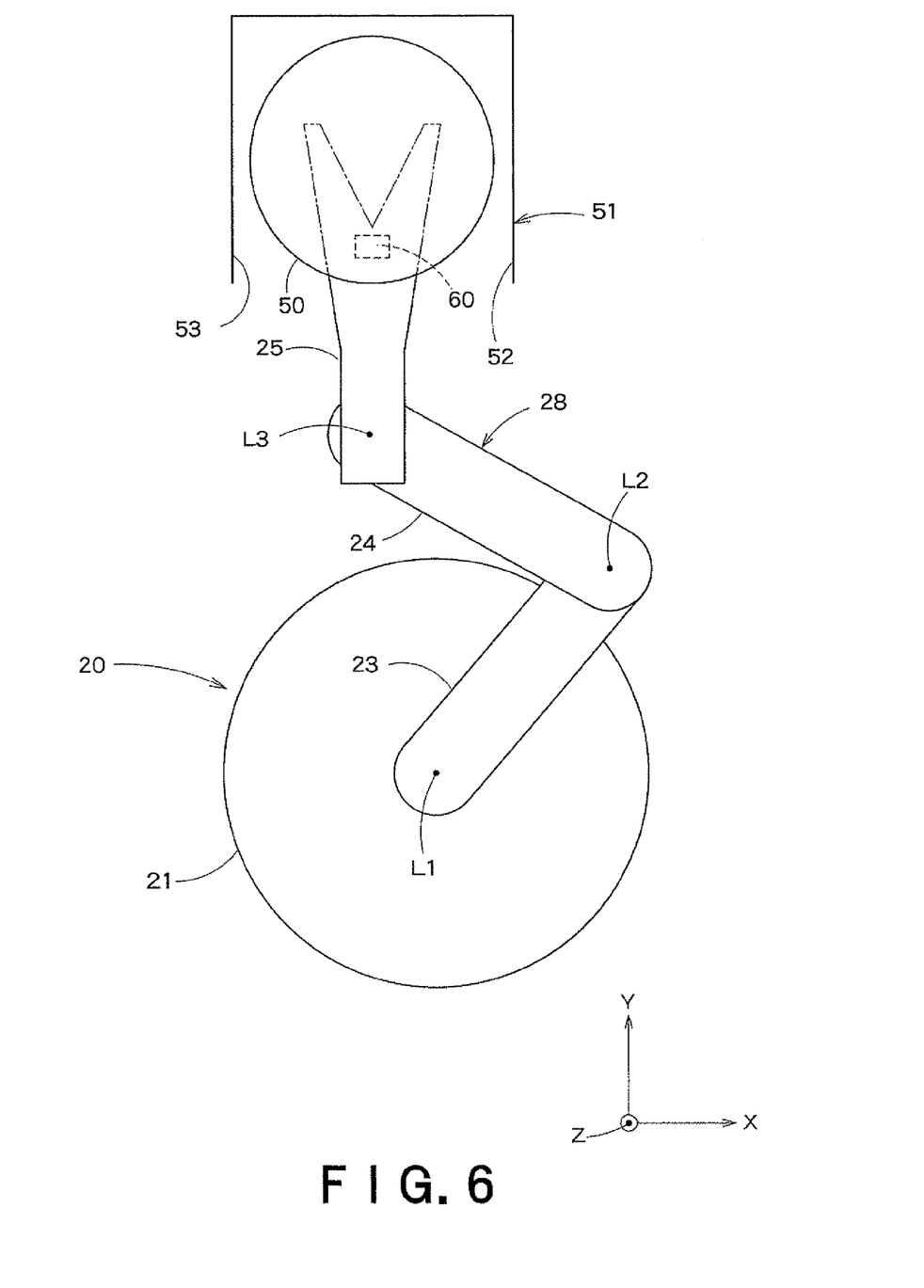
FIG. 6 is a plan view for illustrating an instruction operation for the robot shown in FIG. 1.

Next, a method of instructing the robot 10 about the target position will be described with reference to FIGS. 6 to 8. As will be discussed below, the target is the wafer cassette 51 used for containing the semiconductor wafers 50. In the wafer cassette 51, a plurality of shelves 54, each configured for placing one semiconductor wafer thereon, are formed in left and right inner wall faces 52, 53 with an equal pitch based on the SEMI standard.

The CPU 42 of the robot control unit 40 reads normal positional data and/or temporary positional data, each concerning the wafer cassette 51 and stored in the memory 41. In the data read by the CPU 42, data about each shelf 54 is also included.

Figure 7:
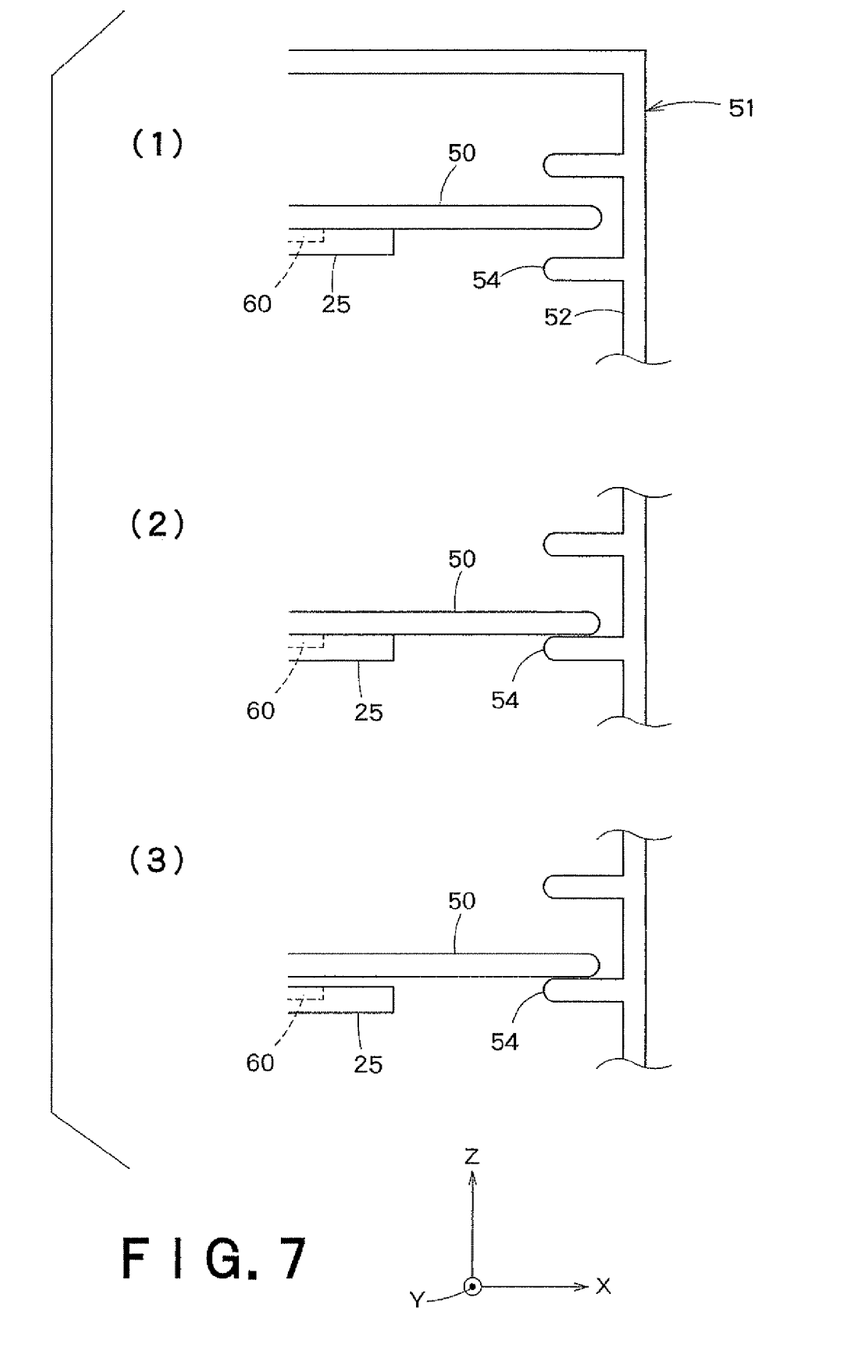
FIG. 7 is a front view for illustrating the instruction operation for the robot shown in FIG. 1.

Then, the robot control unit 40 controls the first arm drive unit 29, second arm drive unit 30, wrist axis drive unit 31 and lift drive unit 32, respectively, based on the read positional data about the cassette, so as to insert each wafer 50 held by the hand 25 into the cassette 51 (FIG. 7(1)).

Figure 8:
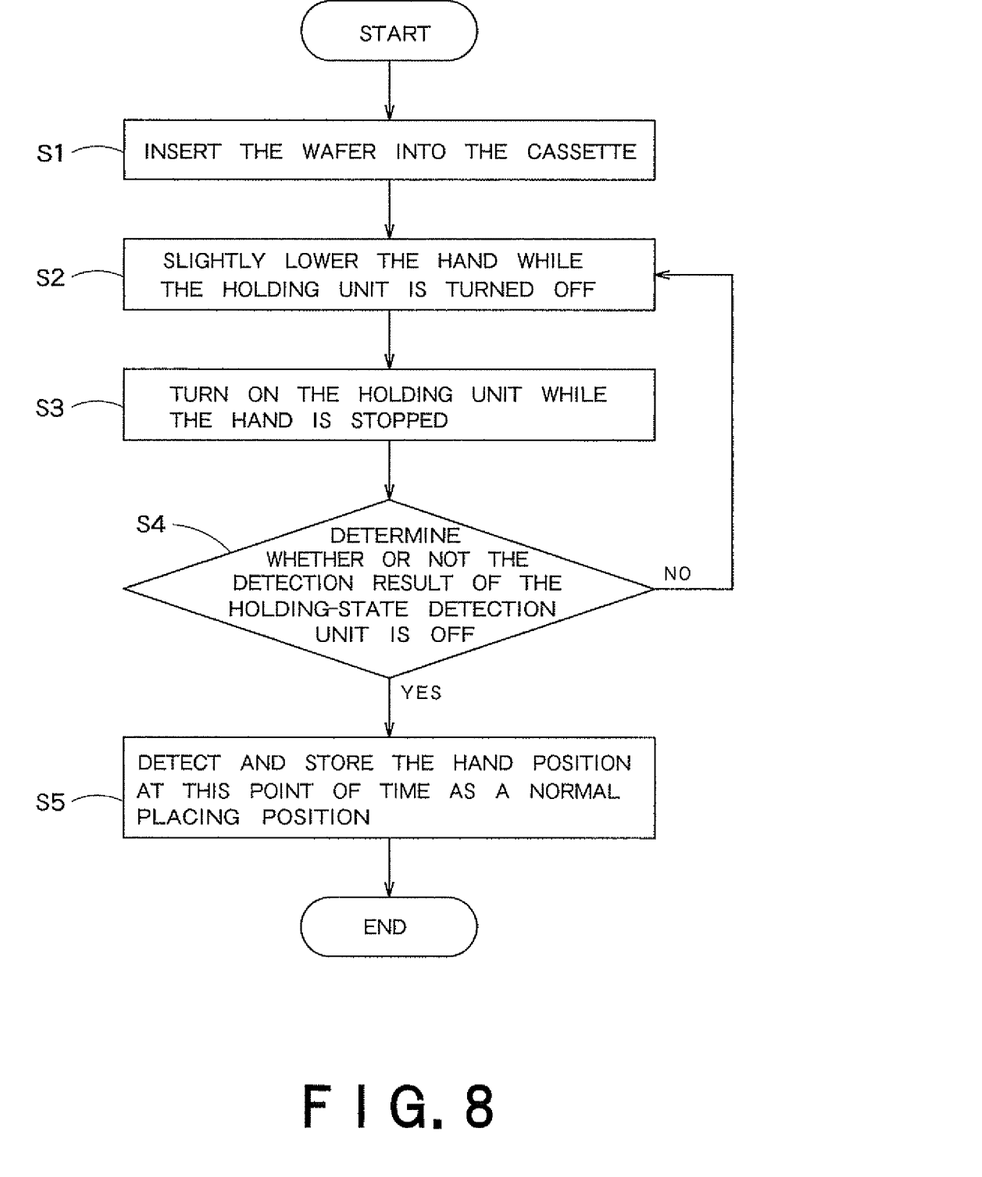
FIG. 8 is a flow chart showing the instruction operation for the robot shown in FIG. 1.

In this case, each wafer 50 is first inserted in a vertically intermediate position between a pair of vertically adjacent shelves 54, based on the temporary positional data of the pair of shelves 54 (Step 1, a wafer insertion step, shown in FIG. 8).

When the wafer 50 is inserted in the cassette 51 as shown in FIG. 7(1), a suitable gap is provided on both upper and lower sides of the wafer 50, such that the wafer 50 can be slightly moved in the vertical direction, especially downward.

Once the wafer 50 is inserted as shown in FIG. 7(1), the robot control unit 40 will turn off the wafer holding unit 60, while lowering the hand 25 by a slight distance and then stopping it by controlling the lift drive unit 32 (Step 2, a lowering step, shown in FIG. 8).

The "slight distance" is set as a distance shorter than a temporary separation distance between the vertically intermediate position determined based on the temporary positional data of the vertically adjacent pair of shelves 54 upon inserting the wafer 50 into the cassette 51 and the temporary position of the lower one of the pair of shelves 54.

Thereafter, while the hand 25 is stopped, the wafer holding unit 60 is turned on again (Step 3, a switching step, shown in FIG. 8). At this time, if the wafer 50 does not yet reach the lower shelf 54 of the cassette 51, the holding-state detection unit 63 will detect that the wafer 50 is held by the wafer holding unit 60 (or obtain a detection result of "ON") (Step 4, a determination step, shown in FIG. 8).

In this manner, when the holding-state detection unit 63 detects that the wafer 50 is held by the wafer holding unit 60, the operation or step is returned to the aforementioned Step 2 (or lowering step), and then the Step 3 (or switching step) is performed again.

By repeating the above operations, the wafer 50 finally reaches the lower shelf 54 and is then supported thereon as shown in FIG. 7(2). In this state, when the hand 25 is further lowered, the wafer 50 will be detached from the hand 25 (FIG. 7(3)).

When the wafer holding unit 60 is turned on while the hand 25 is detached from the wafer 50 (Step 3 or switching step), the holding-state detection unit 63 will detect that the wafer 50 is no longer held by the wafer holding unit 60 (or obtain the detection result of "OFF") (Step 4 or determination step).

In this way, the position of the hand 25 at a point of time when the detection result of the holding-state detection unit 63 is OFF even when the wafer holding unit 60 is turned on will be detected as a normal placing position of the hand 25, and this positional data will be stored in the memory 41 (Step 5, a detection step).

With such an instruction method for the robot 10 according to this embodiment, there is no need for pressing the hand 25 and/or wafer 50 against the target, thus avoiding or eliminating generation of unwanted particles upon the contact. Furthermore, the target position can be detected with high accuracy without being affected by various fluctuation factors and other factors that may be changed with time in the drive system of the robot 10.

Due to the instruction operation by using the robot 10 with the wafer 50 being actually held thereby, significantly accurate instruction data corresponding to a real operation can be obtained.

In the embodiment described above, the instruction operation for the target position (i.e., the position of each shelf 54 of interest) in the vertical direction is performed, while the wafer 50 is held by the hand 25. However, prior to (or after) this instruction operation in the vertical direction, another instruction operation in the horizontal direction of the cassette 51 may also be performed, such as by bringing the wafer 50 held by the hand 25 into contact with left and right inner wall faces 52, 53 of the cassette 51. In such a case, both of the instruction operations about the position in the vertical and horizontal directions can be performed in a quite short time due to a series of operations with the robot according to this invention.

It is noted that, based on the SEMI standard, the wafer cassette 51 is sized to be slightly greater, in the horizontal direction between the left and right inner wall faces 52, 53, than a diameter of the wafer 50. Thus, a gap for allowing the wafer 50 to be slightly moved in the horizontal or lateral direction will be provided on each side of the wafer 50 when the wafer 50 is inserted in the cassette 51. Consequently, the instruction operation in the horizontal direction as described above can also be achieved.

As described above, while preferred embodiments of the present invention have been shown and discussed, these aspects can be suitably modified within the scope and sprit of this invention. For instance, while the robot in the above embodiments has been discussed as one for use in carrying the semiconductor wafers (or circular substrates), it can also be used for carrying glass substrates (or square substrates) used in manufacturing liquid crystal display panels or the like.

The invention claimed is:

1. A robot comprising: a robot arm having a distal end at which an end effector is provided; arm drive unit configured to move the robot arm at least in a vertical direction; holding unit provided to the end effector in order to hold a plate member; holding-state detection unit configured to detect whether or not the plate member is held by the holding unit; and robot control unit configured to control the arm drive unit and the holding unit, wherein the robot control unit is configured to turn off the holding unit while the plate member is placed on the end effector, and control the arm drive unit to lower the end effector, by a predetermined distance, from an initial position higher than a preset temporary placing position toward the temporary placing position, switch the holding unit from an OFF state to an ON state while the end effector is stopped; and determine whether or not the plate member is held by the holding unit by using the holding-state detection unit, and wherein in a case in which the plate member is determined to be held by the holding unit, the robot control unit will turn off the holding unit and further lower the end effector by the predetermined distance, and determine again whether or not the plate member is held by the holding unit while the end effector is stopped, and wherein in a case in which the plate member is determined not to be held by the holding unit, the robot control unit will detect a position of the end effector at this point of time as a normal placing position.

2. The robot according to claim 1,
wherein the holding unit has vacuum suction unit configured to suck the plate member, and
wherein the holding-state detection unit has a vacuum sensor configured to detect that a vacuum state is achieved by the vacuum suction unit.

3. The robot according to claim 1,
wherein the holding unit has edge grip unit including a movable engage portion configured to be releasably engaged with an edge of the plate member and a plunger configured to advance and retract the movable engage portion, and
wherein the holding-state detection unit has a position sensor configured to detect a position of the plunger.

4. The robot according to claim 1,
wherein the normal placing position is each position of a plurality of shelves provided inside a cassette with an equal pitch in the vertical direction, the cassette being configured to contain a plurality of plate members, and
wherein the initial position is a central position in the vertical direction between a pair of vertically adjacent shelves.

5. The robot according to claim 1, wherein the robot arm is configured to be moved with degrees of freedom in X-axial and Y-axial directions as well as with a degree of freedom in Z-axial direction corresponding to the vertical direction.

6. A method of instructing the robot defined in claim 1 about the normal placing position of the plate member, comprising:
a lowering step of turning off the holding unit while the plate member is placed on the end effector, and controlling the arm drive unit to lower the end effector by the predetermined distance from the initial position higher than the preset temporary placing position toward the temporary placing position;
a switching step, provided after the lowering step, of switching the holding unit from the OFF state to the ON state while the end effector is stopped;
a determination step, provided after the switching step, of determining whether or not the plate member is held by the holding unit by using the holding-state detection unit, wherein in the case in which the plate member is determined to be held by the holding unit, the step will be returned to the lowering step; and a detection step of detecting the position of the end effector as the normal placing position at the point of time when the plate member is determined not to be held by the holding unit in the determination step.

7. The method according to claim 6, wherein the normal placing position is each position of the plurality of shelves provided inside the cassette with the equal pitch in the vertical direction, the cassette being configured to contain the plurality of plate members, wherein the initial position is the central position in the vertical direction between the pair of vertically adjacent shelves, and wherein the method further comprises an insertion step, provided prior to a first lowering step, of inserting the plate member held by the end effector into the central position in the vertical direction in the cassette.

* * * * *